(12) United States Patent
Wang

(10) Patent No.: US 7,663,444 B2
(45) Date of Patent: Feb. 16, 2010

(54) AMPLIFYING CIRCUIT UTILIZING NONLINEAR GATE CAPACITANCE FOR ENHANCING LINEARITY AND RELATED METHOD THEREOF

(75) Inventor: Po-Chih Wang, Kao-Hsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 107 days.

(21) Appl. No.: 11/858,137

(22) Filed: Sep. 20, 2007

(65) Prior Publication Data

US 2008/0074194 A1 Mar. 27, 2008

(30) Foreign Application Priority Data

Sep. 25, 2006 (TW) .............................. 95135404 A

(51) Int. Cl.
*H03F 3/191* (2006.01)

(52) U.S. Cl. ..................... 330/302; 330/310; 330/149
(58) Field of Classification Search .................. 330/302, 330/310, 149
See application file for complete search history.

(56) References Cited

U.S. PATENT DOCUMENTS

| | | | | |
|---|---|---|---|---|
| 2,998,514 | A * | 8/1961 | Shields et al. ............. | 246/34 R |
| 3,550,019 | A * | 12/1970 | Thomas ....................... | 327/47 |
| 3,596,206 | A * | 7/1971 | Loria et al. ............. | 331/116 R |
| 3,976,999 | A * | 8/1976 | Moore et al. ................... | 342/90 |
| 5,027,082 | A | 6/1991 | Wisherd et al. | |
| 6,683,499 | B2 * | 1/2004 | Lautzenhiser et al. ........ | 330/295 |
| 7,365,612 | B2 * | 4/2008 | Rohde et al. ........... | 331/107 SL |
| 2008/0094141 | A1 * | 4/2008 | Gotou et al. ................ | 330/295 |

OTHER PUBLICATIONS

C. Wang, M. Vaidyanathan, and L.E. Larson, "A Capacitance-Compensation Technique for Improved Linearity in CMOS Class-AB Power Amplifiers", IEEE-J.Solid-State-Circuits, vol. 39, No. 11, pp. 1927-1937, Nov. 2004.

* cited by examiner

*Primary Examiner*—Patricia Nguyen
(74) *Attorney, Agent, or Firm*—Thomas, Kayden, Horstemeyer & Risley

(57) ABSTRACT

An apparatus for amplifying an input signal is disclosed. The apparatus includes a first amplifying circuit and a first resonating circuit. The first amplifying circuit includes a first transistor having a first gate for receiving the input signal. The first amplifying circuit amplifies the input signal to generate a first output signal. The first resonating circuit is coupled to the first amplifying circuit, wherein a first resonating frequency of the first resonating circuit is not equal to the operating frequency.

23 Claims, 5 Drawing Sheets

US 7,663,444 B2

AMPLIFYING CIRCUIT UTILIZING NONLINEAR GATE CAPACITANCE FOR ENHANCING LINEARITY AND RELATED METHOD THEREOF

BACKGROUND OF THE INVENTION

1. Field of the Invention

The present invention relates to an amplifying circuit, and more particularly to a power amplifying circuit for increasing linearity.

2. Description of the Prior Art

Power amplifiers have been widely used in different kinds of wired or wireless system applications. Normally, there are two means of determining the effectiveness of a power amplifier, the first one being the power gain and the second being the linearity of the power amplifier. The linearity can determine the distortion between the input signal and the output signal of the power amplifier. Furthermore, in advanced CMOS manufacturing techniques, utilizing the ideal system-on-chip (SOC) to implement the whole wireless transmitter chip is more popular. Please refer to C. Wang, M. Vaidyanathan, and L. E. Larson, "A Capacitance Compensation Technique for Improved Linearity in CMOS Class-AB Power amplifiers," *IEEE-J. Solid-State-Circuits*, vol. 39, no. 11, pp. 1927-1937, November 2004 for more information. According to the prior art, the nonlinearity of the CMOS power amplifier is mainly caused by two reasons: the first one is the transconductance Gm of the transistor, which determines the linearity of the transistor; and the second reason is the nonlinear capacitor Cgate at the gate of the transistor, which determines the linearity of the output of the previous stage circuit. The above-mentioned prior art has disclosed a capacitive compensation method to improve the nonlinear capacitor Cgate at the gate of the transistor. However, this conventional method can only be utilized in a CMOS power amplifier having a class AB configuration. Furthermore, the prior art requires an increased chip area and the power gain is not ideal. For the OFDM system, which requires a very high linearity (e.g. the linearity requirement of the specification of 802.11g is as high as 25 dBm at P1 dB), only a power amplifier implemented by a class A configuration can be adopted. However, a power amplifier with a class A configuration will have a bad linearity caused by the above-mentioned problem.

SUMMARY OF THE INVENTION

Therefore, one of the objectives of the present invention is to provide an amplifying circuit to improve the linearity of a power amplifier.

According to an embodiment of the present invention, an amplifying apparatus is provided. The amplifying apparatus comprises a first amplifying circuit comprising a first transistor having a first gate for receiving the input signal, wherein the first amplifying circuit amplifies the input signal to generate a first output signal; and a first resonating circuit, coupled to the first amplifying circuit, wherein a first resonating frequency of the first resonating circuit is not equal to the operating frequency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
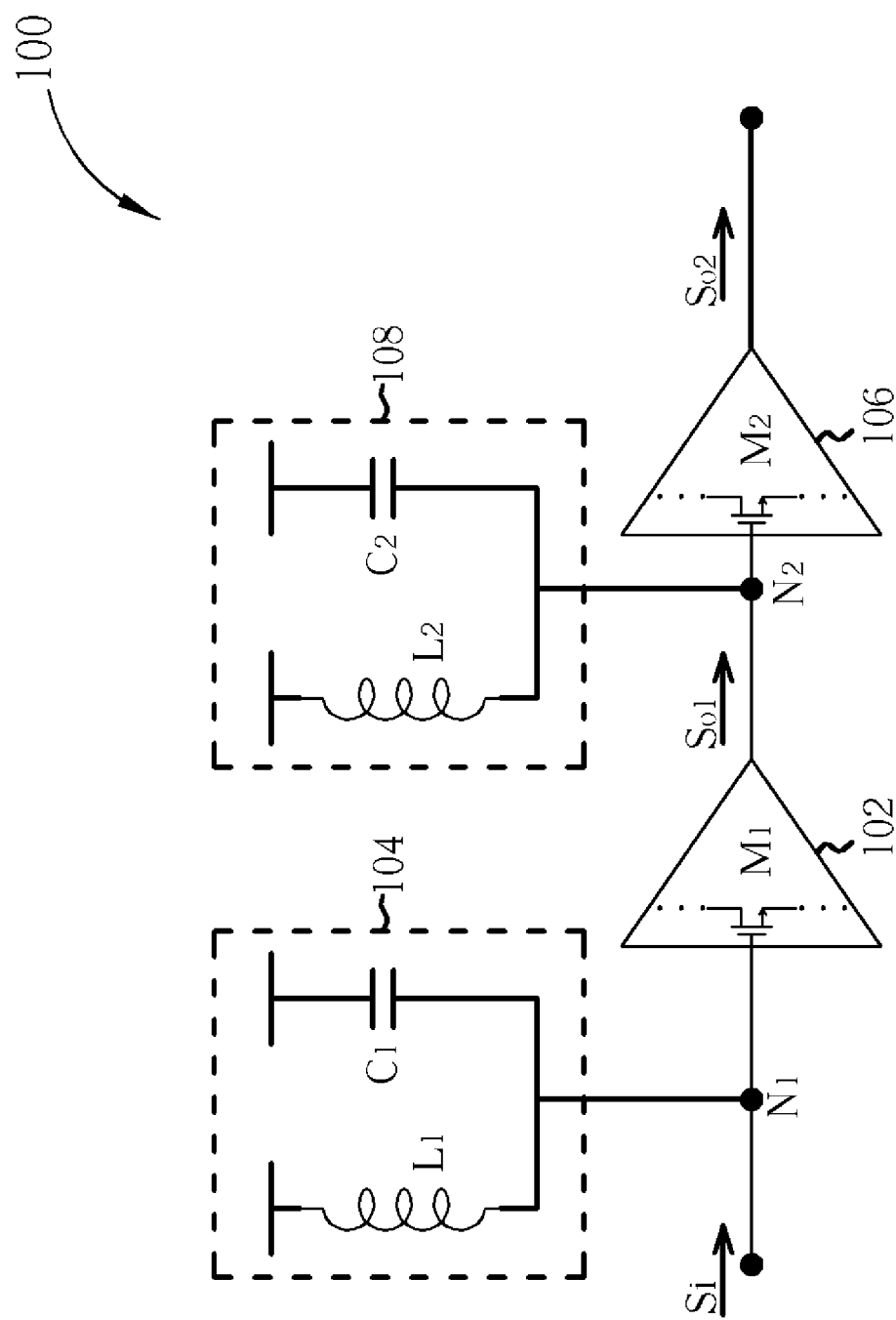
FIG. 1 shows an amplifying apparatus according to an embodiment of the present invention.

FIG. 1 shows an apparatus 100 according to an embodiment of the present invention. The apparatus 100 is utilized for amplifying an input signal $S_i$, where the input signal $S_i$ corresponds to at least one operating frequency $f_o$. The apparatus 100 comprises a first amplifying circuit 102, the first resonating circuit 104, a second amplifying circuit 106, and a second resonating circuit 108. FIG. 1 only shows the devices related to the disclosure of the present invention, but this is not a limitation of the present invention. The first amplifying circuit 102 is utilized for amplifying the input signal $S_i$ to generate a first output signal $S_{o1}$, where the first amplifying circuit 102 comprises a first transistor $M_1$, and the gate $N_1$ of the first transistor $M_1$ receives the input signal $S_i$. Please note that, in this embodiment, the first amplifying circuit 102 is a class AB amplifying circuit. The first resonating circuit 104 comprises an inductor $L_1$ and a capacitor $C_1$, the inductor $L_1$ being connected in parallel with the capacitor $C_1$. A first resonating frequency $f_{soc1}$ of the first resonating circuit 104 is lower than the operating frequency $f_o$. The second amplifying circuit 106 is utilized for amplifying the first output signal $S_{o1}$ to generate a second output signal $S_{o2}$, the second amplifying circuit 106 comprises a second transistor $M_2$, and the gate $N_2$ of the second transistor $M_2$ receives the first output signal $S_{o1}$. Please note that, in this embodiment, the second amplifying circuit 106 is a class A amplifying circuit. The second resonating circuit 108 comprises an inductor $L_2$ and a capacitor $C_2$, and the inductor $L_2$ is connected in parallel with the capacitor $C_2$. Furthermore, a second resonating frequency $f_{soc2}$ of the second resonating circuit 108 is higher than the operating frequency $f_o$. Please note that, as is well known by those skilled in this art, either parallel connection or series connection of at least a capacitor, an inductor, and a resistor can implement the above-mentioned resonating circuit, and both modifications fall within the scope of the present invention.

The first resonating frequency $f_{soc1}$ of the apparatus 100 is obtained by equation (1):

$$f_{soc1}=1/(2\pi(L_1C_1)^{1/2}) \quad (1)$$

The second resonating frequency $f_{soc2}$ is obtained by equation (2):

$$f_{soc2}=1/(2\pi(L_2C_2)^{1/2}) \quad (2)$$

Figure 2:
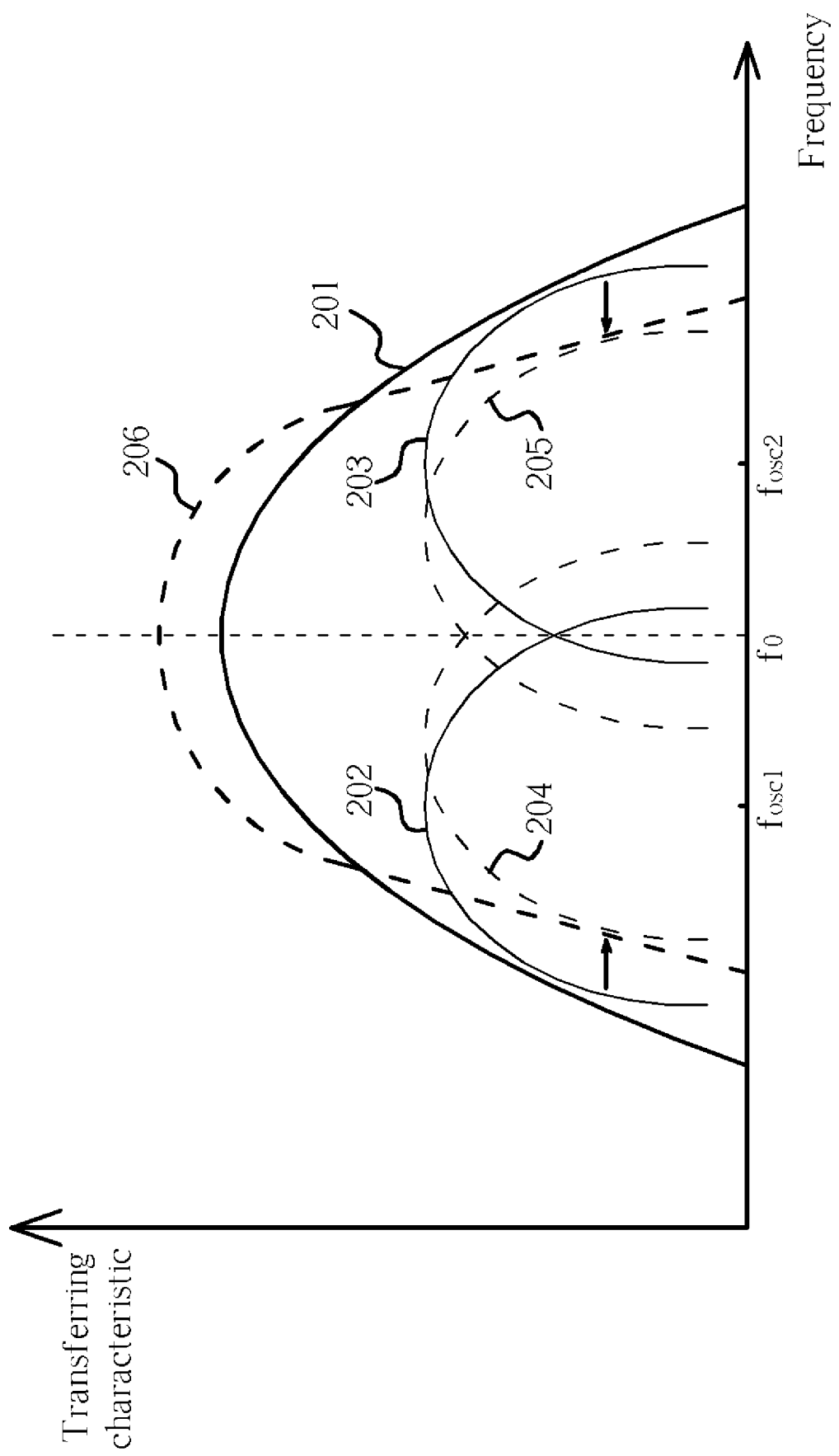
FIG. 2 shows the relationship between frequencies and transferring characteristics of the amplifying apparatus in FIG. 1.

In real operation, the input signal $S_i$ is received from a previous stage circuit, such as a mixer (not shown), and the second output signal $S_{o2}$ is transmitted to a next stage circuit, such as an antenna module (not shown). Please note that the applications of the power amplifier are prior art, and are therefore omitted here for brevity. Furthermore, the above-mentioned inductors $L_1$, $L_2$, and capacitors $C_1$, $C_2$ include the parasitic inductor and parasitic capacitor at the gate $N_1$ and gate $N_2$ respectively. Please refer to FIG. 2. FIG. 2 shows the relationship between frequencies and transferring characteristics of FIG. 1. The curve 201 is the relationship between frequencies and transferring characteristics from the input signal $S_i$ to the second output signal $S_{o2}$ of the apparatus 100. The curve 201 is obtained through the addition of curve 202 and curve 203. The curve 202 is the relationship between frequencies and transferring characteristics from the input signal $S_i$ to the first output signal $S_{o1}$ of the apparatus 100, and the curve 203 is the relationship between frequencies and transferring characteristics from the first output signal $S_{o1}$ to the second output signal $S_{o2}$. Furthermore, the frequency of the peak of the curve 202 and the curve 203 correspond to the first resonating frequency $f_{osc1}$ of the first resonating circuit 104 and the second resonating frequency $f_{osc2}$ of the second resonating circuit 108, respectively, as shown in FIG. 2.

Figure 3:
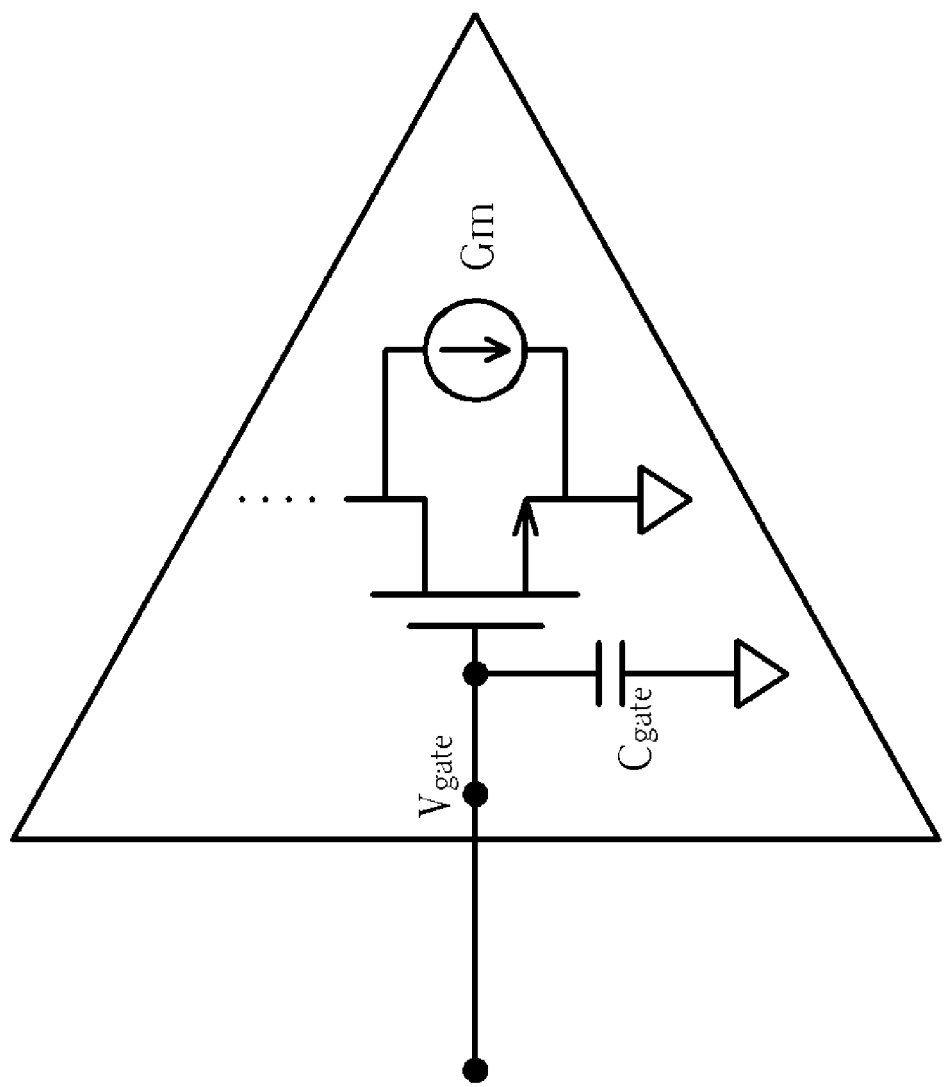
FIG. 3 shows the amplifying circuit represented by an NMOS transistor.
Figure 4:
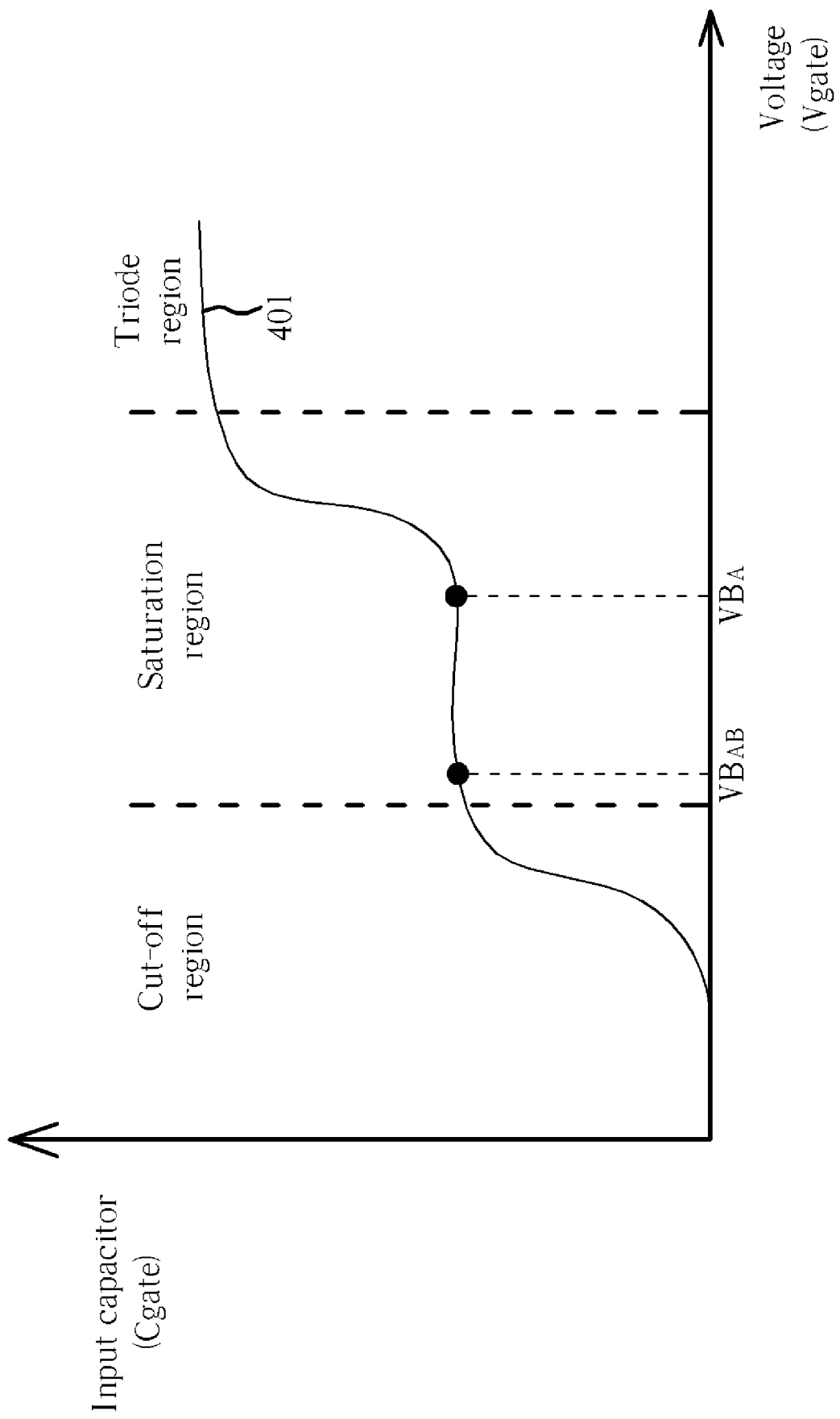
FIG. 4 shows the relationship between the input capacitor and the voltage at the gate of the NMOS transistor in FIG. 3.
Figure 5:
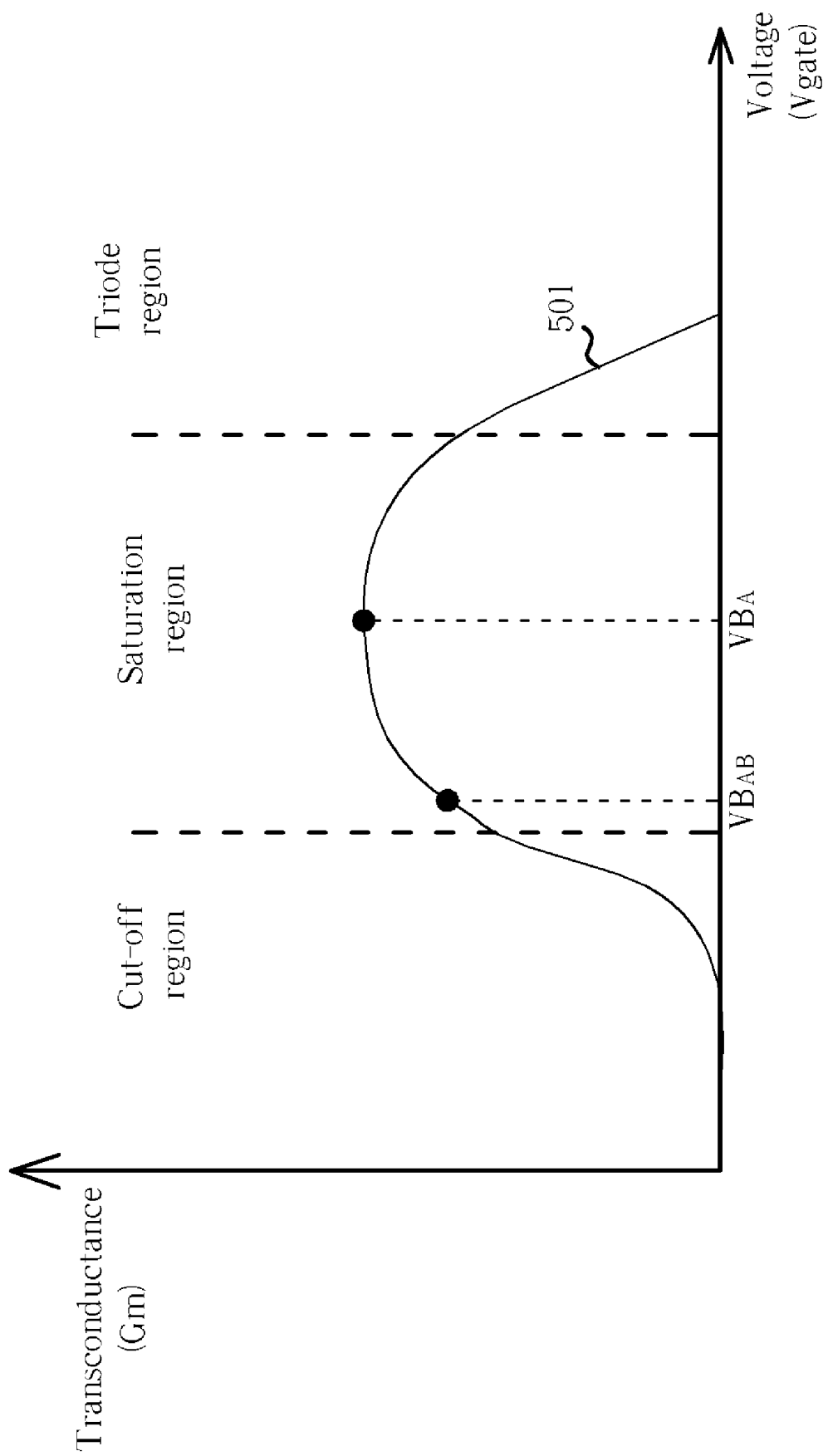
FIG. 5 shows the relationship between the transconductance and the voltage at the gate of FIG. 3.

Because the power (i.e. amplitude) of the input signal $S_i$ received by the apparatus 100 of the present invention is changed in order to conform to system requirements, the equivalent capacitor $C_1$ at the gate $N_1$ of the first transistor $M_1$ of the first amplifying circuit 102 will perform a nonlinear variation with respect to the amplitude of the input signal $S_i$. Similarly, the equivalent capacitor $C_2$ at the gate $N_2$ will also perform a nonlinear variation with respect to the amplitude of the first output signal $S_{o1}$. For brevity, the class A amplifying circuit and the class AB amplifying circuit of the apparatus 100 are simplified into an NMOS transistor (N-type Metal Oxide Semiconductor Transistor), as shown in FIG. 2. Please refer to FIG. 3. FIG. 3 shows the amplifying circuit represented by an NMOS transistor. The gate of the NMOS transistor comprises an input capacitor $C_{gate}$, wherein the voltage of the gate is $V_{gate}$, and the transconductance of the NMOS transistor is $G_m$. Furthermore, the values of the input capacitor $C_{gate}$ of the NMOS transistor are different with respect to the state of the NMOS transistor, which is $WC_{ov}$ at cut-off, $(2/3)WLC_{ox}+WC_{ov}$ at saturation, and $WLC_{ox}+WC_{ov}$ at triode region; wherein W is the effective width of the NMOS transistor, L is the effective length of the NMOS transistor, $C_{ov}$ is the overlap capacitance per unit width, and $C_{ox}$ is the oxide layer capacitance. According to the variation of the input capacitor $C_{gate}$ of the NMOS transistor, a diagram shown in FIG. 4 is obtained. FIG. 4 shows the relationship between input capacitor $C_{gate}$ and the voltage $V_{gate}$ at the gate of FIG. 3. The curve 401 in FIG. 4 is divided into three regions, which are cut-off region, saturation region and triode region. Furthermore, the value of the input capacitor $C_{gate}$ increases from the cut-off region to the triode region. Normally, the operating point of the class A amplifying circuit and the class AB amplifying circuit are biased at the range of the saturation region, as shown in FIG. 4. The difference is that the bias voltage $VB_{AB}$ of the class AB amplifying circuit is closer to the cut-off region, and the bias voltage $VB_A$ of the class A amplifying circuit is closer to the triode region. Please refer to FIG. 5. FIG. 5 is a characteristic curve diagram illustrating the relationship between the transconductance $G_m$ and the voltage $V_{gate}$ at the gate terminal of FIG. 3. In FIG. 5, the curve 501 is divided into three regions, which are cut-off region, saturation region and triode region, wherein the transconductance $G_m$ is an inverted bowl shape. In comparison to the bias voltage of FIG. 4, the bias voltage of the class A amplifying circuit is located in the highest flat region of the curve 501, and the bias voltage of the class AB amplifying circuit is located near to the highest flat region of the curve 501, which is the saturation region of the transistor, and does not drop into the cut-off region of the transistor.

Accordingly, if the amplitude of the input signal $S_i$ at the class AB amplifying circuit (i.e. the first amplifying circuit 102) of the apparatus 100 is increasing gradually, then the partial amplitude that results in the transistor dropping into the cut-off region is larger than the partial amplitude that results in the transistor dropping into the triode region. Equivalently, the first transistor $M_1$ of the class AB amplifying circuit (i.e. the first amplifying circuit 102) will first approach the cut-off state. According to FIG. 4 and FIG. 5, when the amplitude of the input signal $S_i$ gets larger finally resulting in most of the amplitude of the input signal $S_i$ dropping into the cut-off region, the capacitance of the input capacitor $C_{gate}$ at the gate $N_1$ decreases, and the transconductance $G_m$ of the class AB amplifying circuit also decreases (i.e. the reason behind the linearity shortcoming in the prior art). However, because the first resonating frequency $f_{osc1}$ of the first resonating circuit 104 in the apparatus 100 is lower than the operating frequency $f_o$, according to equation (1), when the amplitude of the input signal $S_i$ increases, the decreasing of the input capacitor $C_{gate}$ will result in the first resonating frequency $f_{osc1}$ increasing, to become closer to the operating frequency $f_o$. Those skilled in this art know that the curve 202 will also approach the operating frequency $f_o$ at the same time, as shown by curve 204. Similarly, if the amplitude of the first output signal $S_{o1}$ received by the class A amplifying circuit (i.e. the second amplifying circuit 104) of the apparatus 100 increases gradually, then the partial amplitude resulting in the transistor dropping into the triode region is larger than the partial amplitude resulting in the transistor dropping into the cut-off region. Equivalently, the second transistor $M_2$ of the class A amplifying circuit (i.e. the second amplifying circuit 104) will first approach the triode region state. According to FIG. 4 and FIG. 5, when the amplitude of the output signal $S_{o1}$ gets larger finally resulting in most of the amplitude of the output signal $S_{o1}$ dropping into the triode region, the capacitance of the input capacitor $C_{gate}$ at the gate $N_2$ will first increase, and then decrease. Furthermore, the transconductance $G_m$ of the class A amplifying circuit also decreases (i.e. the reason behind the linearity shortcoming in the prior art). However, because the second resonating frequency $f_{osc2}$ of the second resonating circuit 108 in the apparatus 100 is higher than the operating frequency $f_o$, according to equation (2), when the amplitude of the output signal $S_{o1}$ increases, the decreasing of the input capacitor $C_{gate}$ will result in the second resonating frequency $f_{osc2}$ decreasing, to become closer to the operating frequency $f_o$. However, those skilled in this art know that the curve 203 will also approach the operating frequency $f_o$ at the same time, shown by curve 205. Accordingly, the transferring characteristic curve from the input signal $S_i$ to the second output signal $S_{o2}$ of the apparatus 100 becomes the curve 206, which is the addition of the curve 204 and the curve 205. According to FIG. 2, the signal transferring characteristics at the operating frequency $f_o$ are increased, which compensates for the lowering part of the transconductance $G_m$ of the class A amplifying circuit and the class AB amplifying circuit caused by the increasing amplitude of the input signal $S_i$. Therefore, the apparatus 100 improves the problem of nonlinear transferring characteristics of the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for amplifying an input signal corresponding to an operating frequency, the apparatus comprising:
   a class AB amplifying circuit comprising a first transistor having a first gate for receiving the input signal, wherein the class AB amplifying circuit amplifies the input signal to generate a first output signal; and a first resonating circuit, coupled to the class AB amplifying circuit, wherein a first resonating frequency of the first resonating circuit is lower than the operating frequency.

2. The apparatus of claim 1, wherein the input signal corresponds to an operating frequency band, and the first resonating frequency is lower than a center frequency of the operating frequency band.

3. An apparatus for amplifying an input signal corresponding to an operating frequency, the apparatus comprising:

a class A amplifying circuit comprising a first transistor having a first gate for receiving the input signal, wherein the class A amplifying circuit amplifies the input signal to generate a first output signal; and a first resonating circuit, coupled to the class A amplifying circuit, wherein the first amplifying circuit is a class A amplifying circuit, and the first resonating frequency is higher than the operating frequency.

4. An apparatus for amplifying an input signal having an operating frequency, comprising:

a first amplifier circuit and a first resonating circuit, wherein the first amplifier circuit receives the input signal and generates a first output signal; and a second amplifier circuit and a second resonating circuit, respectively, wherein the second amplifier circuit receives the first output signal to generate a second output signal, wherein at least one of a first resonating frequency of the first resonating circuit and a second resonating frequency of the second resonating circuit is not equal to the operating frequency.

5. The apparatus of claim 4, wherein the first amplifying circuit is a class AB amplifying circuit, the first resonating frequency is lower than the operating frequency, the second amplifying circuit is a class A amplifying circuit, and the second resonating frequency is higher than the operating frequency.

6. The apparatus of claim 5, wherein the input signal corresponds to an operating frequency band, the first resonating frequency is lower than a center frequency of the operating frequency band, and the second resonating frequency is higher than the center frequency.

7. The apparatus of claim 4, wherein the first amplifying circuit is a class A amplifying circuit, the first resonating frequency is higher than the operating frequency, the second amplifying circuit is a class AB amplifying circuit, and the second resonating frequency is lower than the operating frequency.

8. The apparatus of claim 4, wherein when amplitude of the input signal increases, the first and the second resonating frequencies both approach the operating frequency.

9. The apparatus of claim 1, wherein when amplitude of the input signal increases, the first resonating frequency approaches the operating frequency.

10. A method for modifying a nonlinear transferring characteristic of an amplifying circuit, the method comprising:

providing a first amplifying circuit and a first resonating circuit which has a first resonating frequency;

utilizing the first amplifying circuit to receive an input signal corresponding to an operating frequency; and utilizing the first resonating circuit and the first amplifying circuit to amplify the input signal for outputting an amplified signal;

wherein the first resonating frequency is not equal to the operating frequency wherein the first resonating circuit and first amplifying circuit are further configured such that when an amplitude of the input signal increases, the first resonating frequency approaches the operating frequency.

11. The method of claim 10, wherein the first amplifying circuit is a class AB amplifying circuit, and the first resonating frequency is lower than the operating frequency.

12. The method of claim 10, wherein the first amplifying circuit is a class A amplifying circuit, and the first resonating frequency is higher than the operating frequency.

13. The method of claim 10, further comprising:

providing a second amplifying circuit and a second resonating circuit which has a second resonating frequency; and utilizing the second resonating circuit and the second amplifying circuit to amplify the amplified signal for outputting an output signal;

wherein the second resonating frequency is not equal to the operating frequency wherein when amplitude of the input signal increases, the first and the second resonating frequencies both approach the operating frequency.

14. The method of claim 13, wherein the first amplifying circuit is a class AB amplifying circuit, the second amplifying circuit is a class A amplifying circuit, the first resonating frequency is lower than the operating frequency, and the second resonating frequency is higher than the operating frequency.

15. The method of claim 13, wherein the first amplifying circuit is a class A amplifying circuit, the second amplifying circuit is a class AB amplifying circuit, the first resonating frequency is higher than the operating frequency, and the second resonating frequency is lower than the operating frequency.

16. An apparatus for amplifying an input signal with an operating frequency, comprising:

a first amplifying circuit and a first resonating circuit configured to receive and amplify the input signal to generate a first output signal; and a second amplifying circuit and a second resonating circuit coupled to the first amplifying circuit and configured to receive and amplify the first output signal;

wherein the resonating circuits are configured such that when as an amplitude of the input signal and an amplitude of the first output signal increase, the resonating frequencies converge towards the operating frequency.

17. The apparatus of claim 16, wherein the first resonating frequency is lower than the operating frequency and the second resonating frequency is greater than the operating frequency.

18. The apparatus of claim 17, wherein a transferring characteristic between the input signal and the second output signal increases as the first and second resonating frequencies approach the operating frequency.

19. The apparatus of claim 4, wherein resonating frequencies associated with the first and second resonating circuits are set such that a transferring characteristic between the input signal and the second output signal of the second amplifier increases as the resonating frequencies approach the operating frequency.

20. The apparatus of claim 19, wherein the first amplifier circuit and second amplifier circuit are configured such that a biasing voltage of the first amplifier circuit is closer to a cut-off mode of operation than a biasing voltage of the second amplifier circuit.

21. The apparatus of claim 19, wherein the first amplifier circuit comprises a class AB amplifier and the second amplifier circuit comprises a class A amplifier.

22. A method of maintaining linearity in a device for amplifying an input signal with an operating frequency, comprising:

configuring a first resonating circuit such that a first resonating frequency of the first resonating circuit is less than the operating frequency;

configuring a second resonating circuit such that a second resonating frequency of the second resonating circuit is greater than the operating frequency, wherein the first and second resonating circuits are coupled to a first amplifier circuit and second amplifier circuit, respectively; and adjusting a bias voltage of the first amplifier circuit to be closer to a cut-off mode of operation than a bias voltage of the second amplifier circuit such that when an amplitude of the input signal increases, the first and second resonating frequencies approach the operating frequency and a signal transferring characteristic increases.

23. A method for amplifying an input signal with an operating frequency, comprising:

configuring operating points of a first amplifier circuit and a second amplifier circuit such that a biasing voltage of the first amplifier circuit is closer to a cut-off mode of operation than a biasing voltage of the second amplifier circuit; and configuring resonating frequencies of first and second resonating circuits coupled to the first amplifier circuit and second amplifier circuit to oppositely converge on the operating frequency as an amplitude of the input signal increases.

* * * * *